United States Patent [19]

Thompson et al.

[11] Patent Number: 4,755,858

[45] Date of Patent: Jul. 5, 1988

[54] FIELD EFFECT TRANSISTOR

[75] Inventors: George H. B. Thompson, Sawbridgeworth; Piers J. G. Dawe, Harlow, both of England

[73] Assignee: ITT Gallium Arsenide Technology Center, Roanoke, Va.

[21] Appl. No.: 643,892

[22] Filed: Aug. 22, 1984

[30] Foreign Application Priority Data

Aug. 23, 1983 [GB] United Kingdom ............... 8322625

[51] Int. Cl.⁴ .................... H01L 29/80; H01L 27/02; H01L 21/306; B44C 1/22
[52] U.S. Cl. ..................................... 357/22; 156/651; 156/652; 156/662; 357/41; 357/56; 437/41; 437/126; 437/228
[58] Field of Search ............... 156/649, 651, 652, 662; 29/569 L, 571, 580, 591; 357/16, 17, 20, 22, 30, 41, 56; 272/79.1, 79.2, 79.4; 437/23, 41, 126, 129, 228, 234

[56] References Cited

U.S. PATENT DOCUMENTS

| | | | |
|---|---|---|---|
| 4,075,652 | 2/1978 | Umebachi et al. | 437/126 X |
| 4,354,898 | 10/1982 | Coldren et al. | 156/649 X |
| 4,468,850 | 9/1984 | Liau et al. | 156/626 X |
| 4,496,403 | 1/1985 | Turley | 29/569 L |
| 4,636,829 | 1/1987 | Greenwood et al. | 357/30 |

Primary Examiner—William A. Powell
Attorney, Agent, or Firm—Robert A. Walsh; Thomas N. Twomey; Mary C. Werner

[57] ABSTRACT

The gate of a gallium indium arsenide FET grown on an indium phosphide substrate comprises a top layer of GaInAsP (band gap 1.2 eV) a middle layer of GaInAs and a bottom layer of InP. This can be etched to produce an overhanging top layer which allows self-aligned gate contact metallization avoiding the registration problems of a further masking stage.

12 Claims, 1 Drawing Sheet

FIELD EFFECT TRANSISTOR

BACKGROUND OF THE INVENTION

This invention relates to the manufacture of gallium indium arsenide FET's, and in particular to the use of a structure suitable for self-aligned gate formation.

In the construction of FET's it is quite common to require the gate length to be as short as possible, and for some applications a gate length of less than one micron is desirable. In these circumstances mask registration becomes very severe if recourse is not to be had to some form of self-aligning technique. In the case of gallium arsenide FET's such a technique has been described by S. Umebachi et al in a letter entitled "A New Heterojunction Gate GaAs FET" appearing in 'IEEE Transactions on Electron Devices, Vol. ED-22, pp. 613-614 (August, 1974)'.

In a gallium arsenide FET a self-aligned gate structure is provided by making the gate from twin layers, with a lower layer of p-type gallium aluminum arsenide covered by an upper layer of p-type gallium arsenide. Use is then made of an etch which will attack the gallium aluminum arsenide but not the gallium arsenide in order to undercut the upper layer and produce a 'mushroom' whose overhang serves to separate a subsequent metallization into electrically isolated source, gate, and drain regions. However, no direct analogous structure could be found for a gallium indium arsenide FET having a composition providing a lattice constant substantially matched with that of indium phosphide. The provision of the gallium aluminum arsenide layer of the prior art FET relies upon the existence of selective etches that will produce undercutting by virtue of etching gallium aluminum arsenide while leaving gallium arsenide essentially free from attack. It is also advantageous that the gallium aluminum arsenide has a higher band gap than that of the underlying material of the channel of the FET. For a gallium indium arsenide FET we have failed to find a material that we can selectively etch in this undercutting way to leave the underlying gallium indium arsenide layer of the opposite conductivity type substantially unaffected.

SUMMARY OF THE INVENTION

We have found that in the lattice matched composition range from indium phosphide through gallium indium arsenide phosphide to gallium indium arsenide there exists a first range of compositions which are selectively susceptible to a first type of etch, a second range which are selectively susceptible to a second (different) type of etch, and an intermediate range which are susceptible to neither type of etch, and we have further found that by the use of these compositions and etches it is possible to produce undercut structures.

According to the present invention there is provided a self-aligned gate construction of gallium indium arsenide FET having a composition providing a lattice constant substantially matched with that of indium phosphide, in which FET the gate is formed by a stack of three layers of one conductivity type upon a layer of gallium indium arsenide of the opposite conductivity type, wherein the compositions of the three layers of the stack lie in the range from indium phosphide through gallium indium arsenide phosphide to gallium indium arsenide and are such that the topmost has a band gap in the region of 1.2 eV, the bottommost a substantially higher band gap, and the middle layer a substantially lower band gap.

The invention also provides a method of making a self-aligned gate construction of gallium indium arsenide FET having a composition providing a lattice constant substantially matched with that of indium phosphide, wherein a stack of three layers of one conductivity type are grown upon a layer of gallium indium arsenide of the opposite conductivity type, the compositions of the three layers of the stack lying in the range from indium phosphide through gallium indium arsenide phosphide to gallium indium arsenide, and being such that the topmost has a band gap in the region of 1.2 eV, the bottommost a substantially higher band gap, and the middle layer a substantially lower band gap, wherein photolithographic etching is used to etch entirely through the topmost and middle layers of the stack, but not entirely through the bottommost layers of the stack, to define a rib destined to form the gate of the FET, wherein the etch is changed for a first selective etch which will undercut the topmost layer, and the first selective etch is changed for a second selective etch which will etch the bottommost layer but to which the gallium indium arsenide layer of opposite conductivity is resistant, and wherein a layer of metal is deposited upon the etched surface, which metal layer by virtue of the undercutting forms a gate contact region electrically isolated from a source contact region and from a drain contact region.

BRIEF DESCRIPTION OF THE DRAWINGS

There follows a description of the manufacture of a gallium indium arsenide FET embodying the invention in a preferred form. The description refers to the accompanying drawings in which.

DETAILED DESCRIPTION

Figure 1:
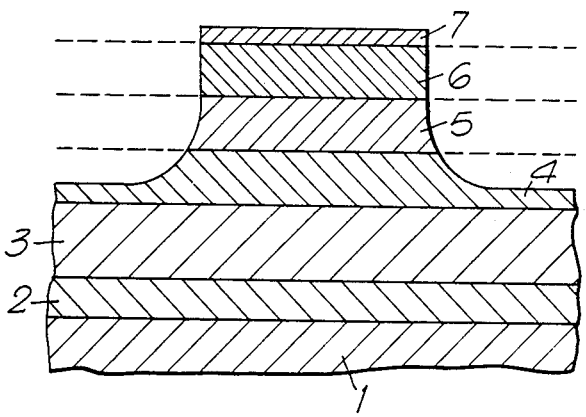
FIGS. 1 to 4 depict schematic cross-sections of successive stages in the manufacture of the device.

Five lattice matched epitaxial layers are grown upon an indium phosphide substrate 1. The first epitaxial layer is a thin low doped $n^-$-type or semi-insulating buffer layer 2 of gallium indium arsenide typically about 0.05 microns thick. This is covered by an n-type layer 3 of gallium indium arsenide typically about 0.2 microns thick which is to form the channel layer of the FET.

Layer 3 is covered by layer 4, which is a p-type layer co-operating with layer 3 to form the p-n junction of the FET. Layer 4 is covered with two further p-type layers 5 and 6 whose compositions are chosen in relation to that of layer 4 so as to enable the three layers to be etched in such a way as to produce undercutting so that self-aligning processing can subsequently be used for the provision of metal contacts for the three terminals of the FET. For the range of lattice matched compositions from indium phosphide through gallium indium arsenide phosphide to gallium indium arsenide there exist some etches that etch gallium indium arsenide, but whose etch rate is greatly reduced with increasing indium phosphide content to the extent that it is effectively zero by the time the band gap of the material has increased from about 0.75 eV (GaInAs) to somewhere in the region of 1.15 eV. Similarly there are other etches that etch indium phosphide, but whose etch rate is greatly reduced with increasing gallium arsenide content to the extent that it is effectively zero by the time the band gap of the material has been reduced from 1.35 eV (InP) to somewhere in the region of 1.25 eV. An example of the former type of etch is ferricyanide etch, whereas an example of the latter is a hydrochloric phosphoric acid etch. This leaves gallium indium arsenide phosphide compositions with band gaps in the neighborhood of 1.2 eV resistant to both sets of etches. Layer 6 is therefore made of this etch resistant composition, while layer 5 is made of ternary or quaternary material satisfactorily etched by the ferricyanide type etches, and layer 4, being made of indium phosphide is susceptible to etching by the hydrochloric phosphoric acid type etches. (Layer 4 can alternatively be made of quaternary material, provided the gallium arsenide proportion is small enough.) Each of these three p-type layers is typically about 0.3 microns thick.

Figure 2:
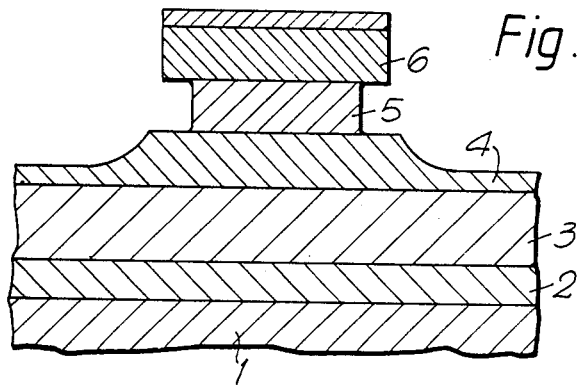
Figure 3:
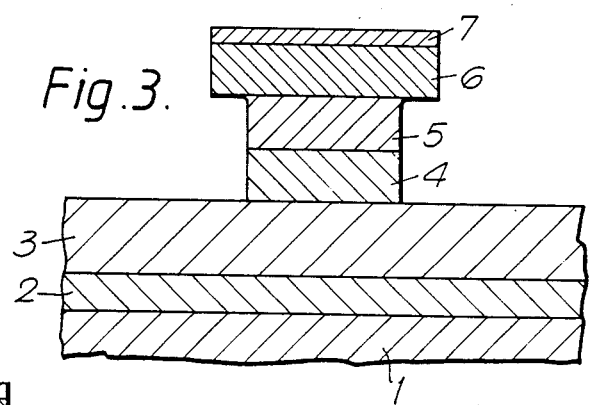
Figure 4:
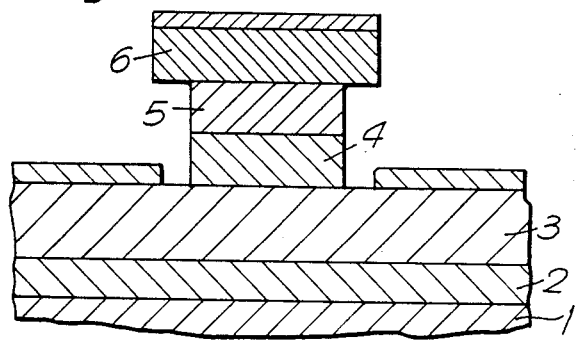

Conventional photolithographic techniques are used for masking preparatory for etching. With a masking layer 7 (FIG. 1) in position, a first stage of etching consists of etching with a strong etch, such as bromine methanol, that will etch the entire range of materials from indium phosphide to gallium indium arsenide. This etching is halted when the etching has penetrated into the p-type indium phosphide layer 4 as depicted in FIG. 1. This etching produces no appreciable undercutting, and is succeeded by etching with ferricyanide which undercuts the edges of layer 6 as depicted in FIG. 2. Then a third etch, an etch with hydrochloric phosphoric acid which will not undercut InGaAsP, is used to remove the rest of the indium phosphide layer 4 that is not masked by the remaining portions of the quaternary layer 5, as depicted in FIG. 3. This configuration of semiconductor layers is then suitable for a subsequent metallization in which the overhang on each side separates the metallization layer into three distinct regions 9, 10 and 11 as depicted in FIG. 4.

The foregoing specific description has related to an FET grown upon an indium phosphide substrate, but it will be evident that a similar FET could be grown in similar manner upon a different substrate with a slightly different lattice constant. All that would be required would be slight changes in the compositions of the epitaxial layers to adjust for the new lattice constant.

It will also be evident that, through the foregoing specific description has related to the manufacture of a single discrete FET, the invention is applicable also to the manufacture of integrated circuits incorporating one or more FET's of this type.

What is claimed is:

1. A self-aligned gate construction of gallium indium arsenide FET having a composition providing a lattice constant substantially matched with that of indium phosphide, said gate comprising a stack of three layers of one conductivity type upon a layer of gallium indium arsenide of opposite conductivity type, wherein the compositions of said three layers of said stack lie in the range from indium phosphide through gallium indium arsenide phosphide to gallium indium arsenide and are such that the top layer of said three layers has a band gap in the region of 1.2 eV, the bottom layer of said three layers has a substantially higher band gap, and the middle layer of said three layers has a substantially lower band gap.

2. A FET in accordance with claim 1, wherein said FET is incorporated in an integrated circuit.

3. A gallium indium arsenide FET comprising:
an indium phosphide substrate;
a gate grown on said substance;
said gate comprising a top layer of GaInAsP, a middle layer of GaInAs, and a bottom layer of InP;
said top layer overhanging said middle and bottom layers.

4. A gallium indium arsenide FET having a composition providing a lattice constant substantially matched with that of indium phosphide, said FET comprising:
a gallium indium arsenide layer of a first conductivity type;
a self-aligned gate construction comprising a stack of three layers of a second conductivity type upon said gallium indium arsenide layer, the compositions of said three layers lying in the range from indium phosphide through gallium indium arsenide phosphide to gallium indium arsenide and being such that the topmost of said three layers has a band gap of approximately 1.2 eV, the bottom layer of said three layers having a substantially higher band gap, and the middle of said three layers having a substantially lower band gap, said first conductivity type being opposite said second conductivity type;
said gate construction being formed by: photolithographically first etching entirely through said topmost and middle layers but not entirely through said bottom layer to define a rib, changing said first etching for a first selective etch to undercut said topmost layer changing said first selective etch to a second selective etch to etch said bottom layer without undercutting, said gallium indium arsenide layer of said first conductivity type being resistant to said second selective etch;
a gate control region on said top layer; and
source and drain contact regions on said gallium indium arsenide layer.

5. A gallium indium arsenide FET in accordance with claim 4, wherein:
said gate contact region, said source and drain contact regions comprise a deposited metal layer, said metal layer of said gate contact region being electrically isolated from said source and drain contact regions by the undercutting of said topmost layer.

6. A gallium indium arsenide FET in accordance with claim 4, wherein said first selective etching is performed with a bromine methanol etch.

7. A gallium indium arsenide FET in accordance with claim 4, wherein said first selective etch is performed with a ferricyanide etch.

8. A gallium indium arsenide FET in accordance with claim 6, wherein said first selective etch is performed with a ferricyanide etch.

9. A gallium indium arsenide FET in accordance with claim 4 wherein, said second selective etch is performed with a hydrochloric phosphoric acid etch.

10. A gallium indium arsenide FET in accordance with claim 6 wherein, said second selective etch is performed with a hydrochloric phosphoric acid etch.

11. A gallium indium arsenide FET in accordance with claim 7 wherein, said second selective etch is performed with a hydrochloric phosphoric acid etch.

12. A gallium indium arsenide FET in accordance with claim 8 wherein, said second selective etch is performed with a hydrochloric phosphoric acid etch.

* * * * *